United States Patent
Lesea (10) Patent No.: US 9,419,624 B2
(45) Date of Patent: Aug. 16, 2016

(54) POWER MANAGEMENT SYSTEM FOR INTEGRATED CIRCUITS

(71) Applicant: Xilinx, Inc., San Jose, CA (US)

(72) Inventor: Austin H. Lesea, Los Gatos, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 14/539,697

(22) Filed: Nov. 12, 2014

(65) Prior Publication Data

US 2016/0134289 A1    May 12, 2016

(51) Int. Cl.
*H03K 19/173* (2006.01)
*H03K 19/177* (2006.01)
*H03K 19/0175* (2006.01)

(52) U.S. Cl.
CPC .. *H03K 19/17772* (2013.01); *H03K 19/017509* (2013.01)

(58) Field of Classification Search
CPC ................ H03K 19/17772; H03K 19/017509
USPC ......................................... 326/37, 38, 41, 47
See application file for complete search history.

(56) References Cited

U.S. PATENT DOCUMENTS

| | | |
|---|---|---|
| 5,362,989 A | 11/1994 | Hennedy |
| 5,519,663 A | 5/1996 | Harper et al. |
| 5,583,457 A | 12/1996 | Horiguchi et al. |
| 5,612,892 A | 3/1997 | Almulla |
| 5,615,162 A | 3/1997 | Houston |
| 5,671,149 A | 9/1997 | Brown |
| 5,682,107 A | 10/1997 | Tavana et al. |
| 5,712,790 A | 1/1998 | Ditlow et al. |
| 5,801,548 A | 9/1998 | Lee et al. |
| 5,811,962 A | 9/1998 | Ceccherelli |
| 5,825,662 A | 10/1998 | Trimberger |
| 5,832,286 A | 11/1998 | Yoshida |
| 5,914,873 A | 6/1999 | Blish |
| 6,038,386 A | 3/2000 | Jain |
| 6,160,418 A | 12/2000 | Burnham |
| 6,169,419 B1 | 1/2001 | De et al. |
| 6,172,518 B1 | 1/2001 | Jenkins, IV et al. |
| 6,208,171 B1 | 3/2001 | Kumagai et al. |
| 6,384,626 B2 | 5/2002 | Tsai et al. |

(Continued)

OTHER PUBLICATIONS

Allen, Phillip E. et al., "Bandgap Voltage Reference," *CMOS Analog Circuits Design*, Apr. 12, 2000, pp. 1-5, Chapter 10, Oxford University Press, Oxford, United Kingdom.

(Continued)

*Primary Examiner* — Daniel D Chang
(74) *Attorney, Agent, or Firm* — LeRoy D. Maunu (57) ABSTRACT

An apparatus includes a plurality of programmable hardware resources and an analog-to-digital converter (ADC) disposed on an IC die. The ADC is configured to quantize values of one or more analog parameters of the IC die. The apparatus also includes a configuration control circuit configured to program the programmable hardware resources in response to a set of configuration data. The programmable hardware resources are programmed to implement a set of circuits specified by the configuration data and to connect the ADC to respective nodes of the IC die for sampling the analog parameters. The apparatus also includes an interface circuit coupled to the ADC and configured to generate a control signal based on quantized values of the one or more analog parameters from the ADC. The interface circuit outputs the control signal to a power supply coupled to a power terminal of the IC die.

18 Claims, 5 Drawing Sheets

(56) References Cited

U.S. PATENT DOCUMENTS

| | | |
|---|---|---|
| 6,466,049 B1 | 10/2002 | Diba et al. |
| 6,489,804 B1 | 12/2002 | Burr |
| 6,583,645 B1 | 6/2003 | Bennett et al. |
| 6,631,502 B2 | 10/2003 | Buffet et al. |
| 6,710,621 B2 | 3/2004 | Devlin et al. |
| 6,711,719 B2 | 3/2004 | Cohn et al. |
| 6,747,478 B2 | 6/2004 | Madurawe |
| 6,839,888 B2 | 1/2005 | Gupta |
| 6,885,563 B2 | 4/2005 | Panella |
| 6,920,627 B2 | 7/2005 | Blodget et al. |
| 6,936,917 B2 | 8/2005 | Lopata et al. |
| 6,950,998 B1 | 9/2005 | Tuan |
| 6,960,934 B2 | 11/2005 | New |
| 7,003,620 B2 | 2/2006 | Avraham et al. |
| 7,078,932 B2 | 7/2006 | Swami |
| 7,080,341 B2 | 7/2006 | Eisenstadt et al. |
| 7,098,689 B1 | 8/2006 | Tuan et al. |
| 7,109,748 B1 | 9/2006 | Liu et al. |
| 7,112,997 B1 | 9/2006 | Liang et al. |
| 7,135,886 B2 | 11/2006 | Schlacter |
| 7,142,009 B1 | 11/2006 | Watt et al. |
| 7,170,315 B2 | 1/2007 | Bakker et al. |
| 7,345,944 B1 | 3/2008 | Jenkins |
| 7,498,835 B1 | 3/2009 | Rahman et al. |
| 7,498,836 B1 | 3/2009 | Tuan |
| 7,498,839 B1 | 3/2009 | Jenkins, IV |
| 7,504,854 B1 | 3/2009 | Look et al. |
| 7,549,139 B1 | 6/2009 | Tuan et al. |
| 7,562,332 B1 | 7/2009 | Tuan et al. |
| 7,581,124 B1 | 8/2009 | Jacobson et al. |
| 8,130,027 B1 | 3/2012 | Tuan |
| 8,461,869 B1 | 6/2013 | Rahim et al. |
| 2002/0008542 A1 | 1/2002 | Tsai et al. |
| 2003/0030326 A1 | 2/2003 | Shenai et al. |
| 2003/0173993 A1 | 9/2003 | Gupta |
| 2004/0103238 A1 | 5/2004 | Avraham et al. |
| 2004/0145955 A1 | 7/2004 | Mizuno et al. |
| 2005/0040851 A1 | 2/2005 | New |
| 2005/0091547 A1 | 4/2005 | Hanrieder et al. |
| 2005/0201174 A1 | 9/2005 | Klein |
| 2005/0237083 A1* | 10/2005 | Bakker .................. G01K 7/015 326/47 |
| 2006/0053246 A1 | 3/2006 | Lee |
| 2006/0069851 A1 | 3/2006 | Chung et al. |
| 2006/0202713 A1 | 9/2006 | Shumarayev |
| 2007/0001720 A1 | 1/2007 | Li et al. |

OTHER PUBLICATIONS

Burd, Thomas D. et al., "A Dynamic Voltage Scaled Microprocessor System," *Journal of Solid-State Circuits*, Nov. 2000, pp. 1571-1580, vol. 35, No. 11, IEEE, Piscataway, New Jersey, USA.

Hamzaoglu, Faith et al., "Circuit-Level Techniques to Control Gate Leakage for sub-100nm CMOS," *Proc. of the International Symposium on Low Power Electronics and Design*, Aug. 12, 2002, pp. 60-63, ACM, New York, New York, USA.

He, Lei, *Power Efficient FPGA: Circuit, Fabrics and CAD Algorithms*, Feb. 13, 2004, pp. 1-50, Univ. of California, Los Angeles, Electrical Engineering Department, Los Angeles, California, USA.

Intel, *Intel PXA27x Processor Family Power Requirements*, Application Note, Order No. 280005-002, pp. 1-36, Intel Corporation, Santa Clara, California, USA.

Inukai, T. et al., "Boosted Gate MOS (BGMOS): Device-Circuit Cooperation Scheme to Achieve Leakage- Free Giga-Scale Integration,"*Proc. of the 2000 IEEE Custom Integrated Circuits Conference*, May 24, 2000, pp. 409-412, , IEEE, Piscataway, New Jersey, USA.

Kuroda, Tadahiro et al., "A 0.9V, 150-MHz, 1--mW, 4 mm2, 2-D Discrete Cosine Transform Core Processor with Variable Threshold-Voltage (VT) Scheme," *IEEE Journal of Solid-State Circuits*, Nov. 1996, pp. 1770-1779, vol. 31, No. 11, IEEE, Piscataway, New Jersey, USA.

Microchip Technology, *Micropower Voltage Supervisors*, DS21906B, Mar. 2005, pp. 1-28, Microchip Technology Inc., San Jose, California, USA.

Mutoh, Shin'ichiro et al., "1-V Power Supply High-Speed Digital Circuit Technology with Multithreshold-Voltage CMOS," IEEE Journal of Solid-State Circuits, Aug. 1995, pp. 847-854, vol. 30, No. 8, IEEE, Piscataway, New Jersey, USA.

Nowka, Kevin J. et al., "A 32-bit PowerPC System-on-a-Chip With Support for Dynamic Voltage Scaling and Dynamic Frequency Scaling," *IEEE Journal of Solid-State Circuits*, Nov. 2002, pp. 1441-1447, vol. 37, No. 11, IEEE, Piscataway, New Jersey, USA.

Park, Jae Y. et al., "A Comparison of Micromachined Inductors with Different Magnetic Core Materials," *Proc. of the 1996 IEEE Electronic Components and Technology Conference*, May 28, 1996, pp. 375-381, IEEE, Piscataway, New Jersey, USA.

Stratakos, Anthony J. et al., "A Low-Voltage CMOS DC-DC Converter for a Portable Batery-Operated System," *Proc. of the 25th Annual IEEE Power Electronics Specialist Conference*, Jun. 20, 1994, pp. 619-626, vol. 1, IEEE, Piscataway, New Jersey, USA.

Stratakos, Anthony J. et al., *A High-Efficiency Low-Voltage DC-DC Conversion for Portable Applications*, Dec. 1998, PhD dissertation, Chapter 3, pp. 42-78 (39 pp. total), Univ. of California Berkeley, Berkeley, California, USA.

Takahashi, M. et al.; "A 60-mW MPEG4 Video Codec Using Clustered Voltage Scaling with Variable Supply-Voltage Scheme," *IEEE Journal of Solid-State Circuits*, Nov. 1998, pp. 1772-1780, vol. 33, No. 11, IEEE, Piscataway, New Jersey, USA.

Texas Instruments, *32×8 Nonvolatile SRAM*, Datasheet bq4011/bq4011Y, Aug. 1993, pp. 1-11, Texas Instruments Incorporated, Dallas, Texas, USA.

Texas Instruments, *32 k × 8 Nonvolatile SRAM (5 V, 3.3 V)*, Datasheet bq401/Y/LY, May 1999, pp. 1-15, Texas Instruments Incorporated, Dallas, Texas, USA.

Xilinx, *Spartan-3L Low Power FPGA Family*, DS313 (v1.1), Sep. 15, 2005, pages 1-10, Xilinx, Inc., San Jose, California, USA.

Xilinx, *Virtex-II Pro Platform FPGA Handbook*; U G012 (v2.0), Oct. 14, 2002, pp. 19-71 (56 pp. total), Xilinx, Inc., San Jose, California, USA.

US 6,981,160, 12/2005, Thaker et al. (withdrawn)

* cited by examiner

POWER MANAGEMENT SYSTEM FOR INTEGRATED CIRCUITS

TECHNICAL FIELD

The disclosure generally relates to integrated circuits, and more particularly to power management of integrated circuits.

BACKGROUND

Programmable integrated circuits (ICs) are devices that can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnects and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs include an embedded processor that is capable of executing program code. The processor can be fabricated as part of the same die that includes the programmable logic circuitry and the programmable interconnect circuitry, also referred to collectively as the "programmable circuitry" of the IC. It should be appreciated that execution of program code within a processor is distinguishable from "programming" or "configuring" the programmable circuitry that may be available on an IC. The act of programming or configuring the programmable circuitry of an IC results in the implementation of different physical circuitry as specified by the configuration data within the programmable circuitry.

SUMMARY

An apparatus is disclosed that includes a plurality of programmable hardware resources and an analog-to-digital converter (ADC) disposed on an IC die. The ADC is configured to quantize values of one or more analog parameters of the IC die. A configuration control circuit is also disposed on the IC die. In response to a set of configuration data, the configuration control circuit programs the programmable hardware resources to implement a set of circuits specified by the set of configuration data. The programming by the configuration control circuit also causes the programmable hardware resources to connect the ADC to respective nodes of the IC die for sampling the one or more analog parameters. The apparatus also includes an interface circuit coupled to the ADC and configured to generate a control signal based on quantized values of the one or more analog parameters from the ADC. The interface circuit outputs the control signal to a power supply coupled to a power terminal of the IC die.

An apparatus is also disclosed that includes a hierarchical arrangement of master-slave communication interfaces. The apparatus includes a top-level power management circuit disposed on a first die and including a first master communication interface. The apparatus also includes a system disposed on one or more additional dies. The system includes a system-level power management circuit having a first slave communication interface, communicatively coupled to the first master communication interface, and a second master communication interface. The system also includes one or more sub-system circuits. The sub-system circuits have respective slave communication interfaces communicatively coupled to the second master communication interface.

Other features will be recognized from consideration of the Detailed Description and Claims, which follow.

BRIEF DESCRIPTION OF THE DRAWINGS

Various aspects and features of the disclosed circuits and apparatuses will become apparent upon review of the following detailed description and upon reference to the drawings, in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

Due to variation in the lithography process of integrated circuit manufacture, different ICs of the same design may operate differently and exhibit different performance at various process, voltage, and temperature (PVT) corners. For instance, an IC that exhibits acceptable performance levels at a first PVT corner may nevertheless exhibit performance degradations at other PVT corners that may be dynamically induced. Using a process referred to as voltage scaling, voltage may be increased or decreased to achieve the desired performance. For example, faster devices can meet a specified timing requirement with lower voltages, and slower devices may require a higher voltage to achieve the specified timing requirement. As another example, voltage may be adjusted to maintain a desired performance as the operating temperature of an IC changes.

Methods and circuits for power regulation are disclosed that adjust a supply voltage IC based on analog operating parameters exhibited by the IC during operation. Analog operating parameters are sampled, using an on-die analog to digital converter (ADC), and used to generate feedback/control signals to adjust a power supply used to provide a supply voltage to IC. By adjusting the supply voltage via the power supply, circuitry needed for on-die charge pumps and/or voltage regulators can be reduced or eliminated.

In some implementations, an apparatus includes programmable hardware resources and an analog-to-digital converter (ADC) disposed on an IC die. The ADC is configured to quantize values of one or more analog parameters of the IC die. The apparatus also includes a configuration control circuit that is configured to program the programmable hardware resources in response to a set of configuration data. The programmable hardware resources are programmed to implement a set of circuits specified by the configuration data and to connect the ADC to respective nodes of the IC die for sampling the analog parameters. The apparatus also includes an interface circuit that is coupled to the ADC and is configured to generate a control signal based on quantized values of the one or more analog parameters from the ADC. The interface circuit outputs the control signal to a power supply coupled to a power terminal of the IC die. In various implementations, the quantized values may be provided to the interface from multiple ADCs on the IC die. For ease of explanation, the examples may be primarily discussed with reference to a single ADC that provides quantized values to the interface circuit.

The ADC may be configured to quantize various analog parameters of the IC including, for example, voltage of an internal node of the IC or an I/O terminal, temperature, switching speed, and/or latency. In one implementation, the interface circuit includes logic circuitry configured to perform one or more power management functions based on the analog parameters quantized by the ADC. For example, the interface circuit may be configured to reset or shut down the IC in response to the analog parameters quantized by the ADC being indicative of an error.

As another example, the interface circuit is configured to adjust the control signal output to the power supply based on a difference between a voltage quantized by the ADC and a target voltage. The target voltage may be indicated, for example, by a value stored in a non-volatile memory or in a set of configuration data received by the configuration control circuit. As another example, the interface circuit may determine the target voltage using a look up table (LUT) having different target voltages indicated for different values of the quantized analog parameter(s). For instance, the LUT may indicate target voltages for various temperatures or voltages measured on the IC.

In some implementations, the interface circuit may be configured to adjust the control signal provided to the voltage source to adjust a voltage provided to the IC and to maintain a voltage quantized by the ADC within a predetermined voltage range. The predetermined voltage range may be specified, for example, in a non-volatile memory disposed on the IC die, in an external memory connected to the IC die, or in configuration data received by the configuration control circuit.

In some implementations, the interface circuit may be configured to perform various actions in response to the quantized voltage value being outside of the predetermined voltage range. As one example, an alert signal may be generated in response to the quantized value being outside of the range.

As another example, the IC die may power down the IC die or place the IC in a safe mode in response to the quantized value being outside of the range.

In some implementations, the interface circuit is configured to adjust the voltage provided to the IC, via the control signal, to compensate for IR drop on the IC die. IR drop refers to a voltage drop of a supply voltage as the supply voltage is distributed across a power distribution network of the IC. IR drop across a power distribution network may increase as circuit load powered by the power distribution network increases. For instance, on a programmable IC, IR drop may increase after programmable resources are programmed to implement a set of circuits specified by configuration data.

In one example implementation, the interface circuit retrieves a first quantized value of a voltage at a power distribution node in response to the IC die being powered on and prior to programming the programmable hardware resources. After programming the programmable hardware resources, the interface circuit retrieves a second quantized value of the voltage of the power distribution node. The interface circuit determines a target voltage for the power supply based on a difference between the first and second quantized values.

In some implementations, the interface circuit may communicate one or more status parameters, such as values quantized by the ADC, to the power supply in addition to or in lieu of the control signal. The power supply may include logic circuitry that adjusts the voltage generated by the power supply based on the status parameters. For instance, the power supply may be configured to power off the IC in response to a temperature of the IC indicated by the status parameters exceeding a threshold.

Different implementations may use various communication circuits and/or protocols to communicate data between the ADC and the interface circuit and between the interface circuit and the power supply. In some implementations, the circuits are configured to communicate using a hierarchical arrangement of master-slave communication interfaces. In one example implementation, the interface circuit on the IC die includes a first slave communication interface configured to provide the control signal to a first master communication interface in the power supply. The interface circuit on the IC die also includes a second master communication interface. A second slave communication interface on the IC die is configured to provide the quantized values of the one or more analog parameters from the ADC to the second master communication interface.

Figure 1:
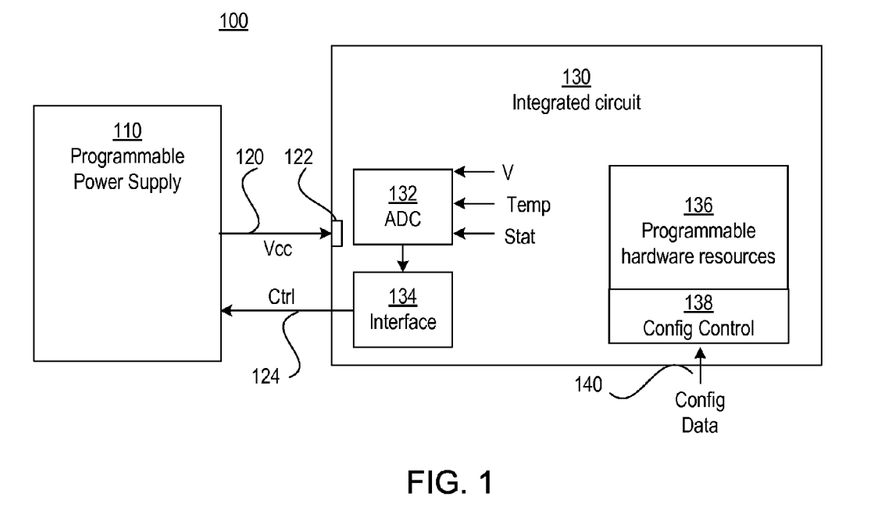
FIG. 1 shows a first arrangement for controlling power on an IC die.

Turning now to the figures, FIG. 1 shows a first circuit arrangement for controlling power on an IC die. The circuit arrangement 100 includes an IC 130 and a programmable power supply 110. The programmable power supply 110 is configured to provide a supply voltage 120 to a power terminal 122 of the IC 130. The IC 130 includes an ADC 132 configured to quantize various analog parameters, such as voltage, temperature, or status of one or more sub-circuits on the IC 130. The IC 130 includes an interface circuit 134 communicatively coupled to the ADC 132 and configured to generate a control signal 124 based on the parameter values quantized by the ADC 132. The interface circuit 134 outputs the control signal 124 to the programmable power supply 110. The control signal 124 directs the programmable power supply 110 to adjust the supply voltage 120 provided to the power supply terminal of the IC 130.

In this example, the IC 130 includes a set of programmable hardware resources 136 and a configuration control circuit 138. The configuration control circuit 138 is configured to program the programmable hardware resources 136 to implement circuits specified in a set of configuration data 140. In some implementations, the programming of the programmable hardware resources 136 may also configure programmable routing resources to route one or more analog parameter values to the ADC 132. For instance, the configuration data may cause the programmable hardware resources 136 to route a voltage from a specific node of the IC 130 to the ADC 132. In some implementations, the configuration control circuit 138 may also specify or adjust a function used by the interface circuit 134 to generate the control signal 124.

In this example, the ADC 132 and the interface circuit 134 are shown as being separate from the set of the programmable hardware resources 136. However, in some implementations, the ADC 132 and/or the interface circuit 134 may be ones of the set of programmable hardware resources 136, or implemented from a subset of the programmable hardware resources 136.

Figure 2:
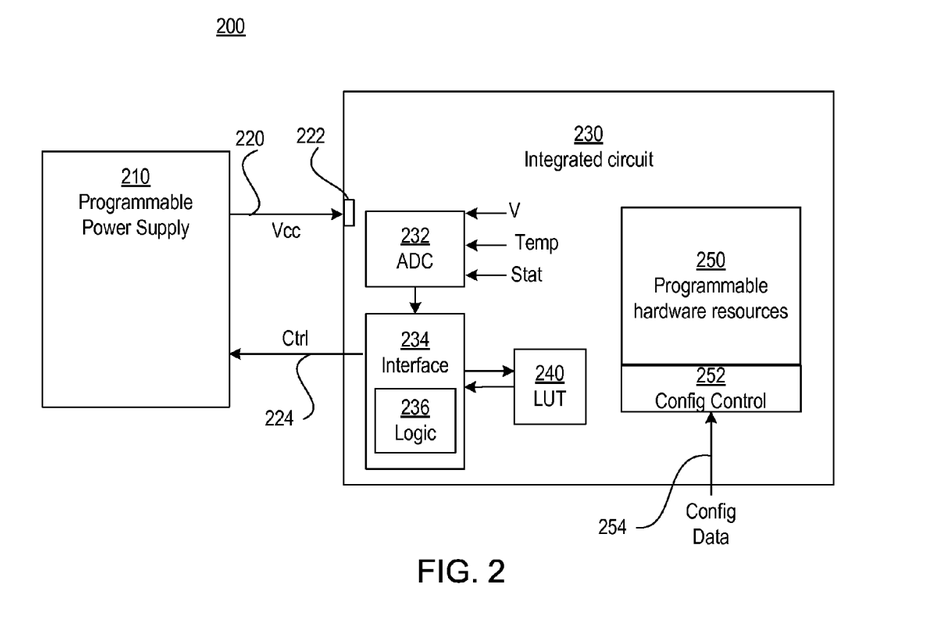
FIG. 2 shows a second arrangement for controlling power on an IC die.

FIG. 2 shows a second circuit arrangement for controlling power on an IC die. The circuit arrangement 200 includes an IC 230 and a programmable power supply 210. The programmable power supply 210 is configured to generate a supply voltage 220 as a function of an input control signal 224 and provide the supply voltage 220 to a power terminal 222 of the IC 230. The IC 230 includes an ADC 232 configured to quantize various analog parameters, such as voltage, temperature, or status of one or more sub-circuits on the IC 230. The IC 230 includes an interface circuit 234 communicatively coupled to the ADC 232 and configured to generate the control signal 224 based on the parameter values quantized by the ADC 232. The interface circuit 234 outputs the control signal 224 to the programmable power supply 210.

In this example, the interface circuit 234 includes a logic circuit 236 configured to determine a target voltage for the IC 230 using a LUT 240. The LUT 240 may specify, for example, respective target voltages for various combinations of values of the analog parameters quantized by the ADC 232.

Alternatively or additionally, the logic circuit 236 in the interface circuit 234 may be configured to perform one or more power management functions based on the analog parameters quantized by the ADC. For example, the logic circuit 236 may be configured to reset or shut down the IC 230 in response to the analog parameters quantized by the ADC 232 being indicative of an error. As another example, the logic circuit 236 may be configured to set the control signal 224 to reduce the supply voltage 220 in response to a quantized temperature parameter exceeding a threshold value.

In this example, the IC 230 includes a set of programmable hardware resources 250 and configuration control circuit 252 configured to program the programmable hardware resources 250 to implement circuits specified in a set of configuration data 254. In some implementations, the programming of the programmable hardware resources 250 may also configure programmable routing resources to route one or more analog parameter values to the ADC 232. Additionally or alternatively, configuration control circuit 252 may specify or adjust the functions performed by the logic circuitry 236 of the interface circuit 234. For example, the configuration control circuit 252 may configure the logic circuit 236 to determine a target voltage or adjust the control signal 224 according to a function specified by the configuration data. Similarly, in some implementations, the configuration control circuit 252 may create or adjust the LUT 240 according to the configuration data 254.

In this example, the ADC 232, the interface circuit 234, and the LUT 240 are shown as being separate from the set of the programmable hardware resources 136. However, in some implementations, the ADC 232, the interface circuit 234, and/or the LUT 240 may be implemented using the programmable hardware resources 250.

Figure 3:
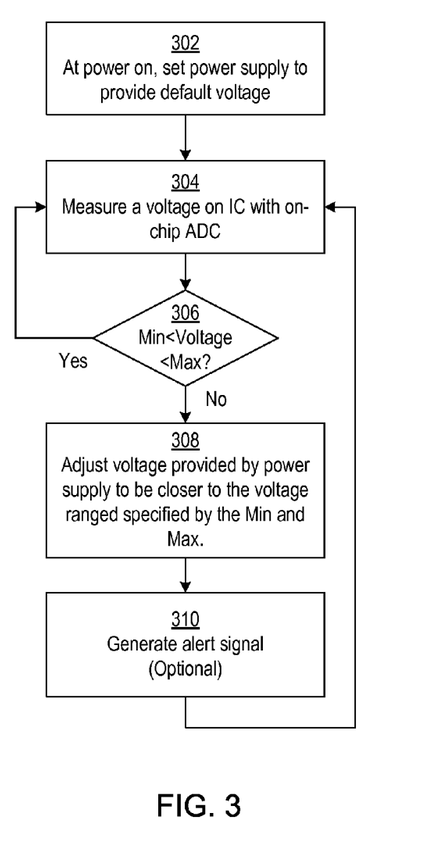
FIG. 3 shows a first process for controlling voltage using an ADC disposed on an IC die.
Figure 4:
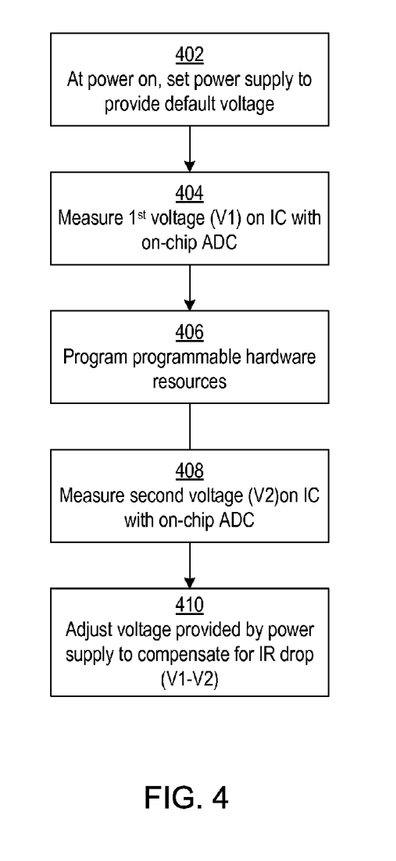
FIG. 4 shows a second process for controlling voltage using an ADC disposed on an IC die.
Figure 5:
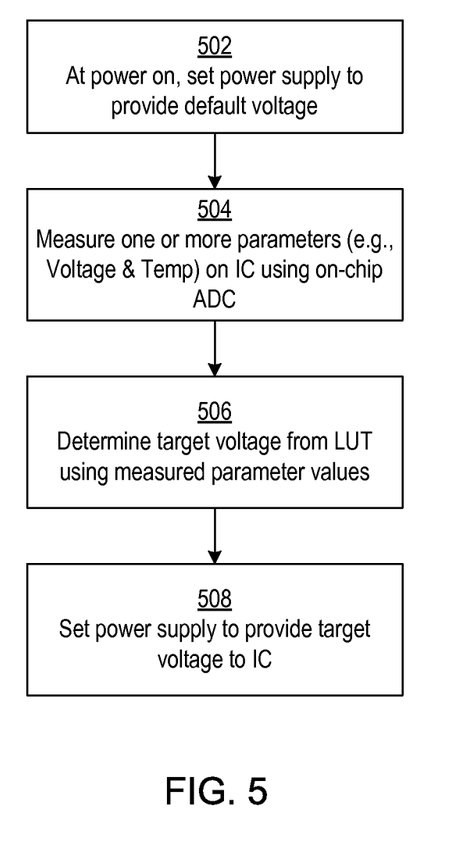
FIG. 5 shows a third process for controlling voltage using an ADC disposed on an IC die.

In different implementations, the interface circuit may utilize various processes to adjust a supply voltage based on analog parameter values quantized by an ADC on the IC. FIGS. 3, 4, and 5 shows some example processes that may be performed by an interface circuit on an IC to control a supply voltage provided to the IC.

FIG. 3 shows a first example process for controlling a supply voltage provided to the IC. When the IC is powered on, at block 302, the power supply is set to provide a default voltage to the IC. At block 304, a voltage on the IC is measured with an on-chip ADC disposed on the IC. While the voltage is within a desired voltage range defined by a minimum voltage and a maximum voltage, decision block 306 directs the process to repeat the voltage measurement at block 304.

If the voltage measured at block 304 is outside of the voltage range, decision block 306 directs the process to block 308. At block 308, the power supply is adjusted to bring the voltage back toward the desired voltage range. Optionally, the process may generate an alert signal in response to the voltage being outside of the desired voltage range. The measuring and adjusting is repeated at blocks 304, 306, and 308 until the voltage is within the desired voltage range.

FIG. 4 shows a second example process for controlling a supply voltage provided to the IC. When the IC is powered on, at block 402, the power supply is set to provide a default voltage to the IC. At block 404, a first voltage (V1) at a node on the IC is measured with an on-chip ADC disposed on the IC. At block 406, programmable hardware resources are programmed according to a set of configuration data. The programming of the programmable hardware resources increases the load on the power distribution lines on the IC and may increase IR drop exhibited on the power distribution lines. At block 408, a second voltage (V2) at the node is measured with the ADC. At block 410, the voltage provided by the power supply is adjusted to compensate for the increased IR drop indicated by the difference between the first and second voltages. In some implementations, the process may repeat measurement of the voltage V2 on the node at block 408 and repeat adjustment of the voltage at block 410 based on the difference between V2 and V1.

FIG. 5 shows a third example process for controlling a supply voltage provided to the IC. When the IC is powered on, at block 502, the power supply is set to provide a default voltage to the IC. At block 504, one or more operating parameters of the IC are measured using an ADC disposed on the IC. At block 506, a target voltage is determined from a LUT using the measured parameter value(s). As discussed with reference to FIG. 2, the LUT may specify respective target voltages for different values of the operating parameters measured at block 504. At block 508, the power supply is set, via a control or feedback signal, to provide the target voltage to the IC.

Figure 6:
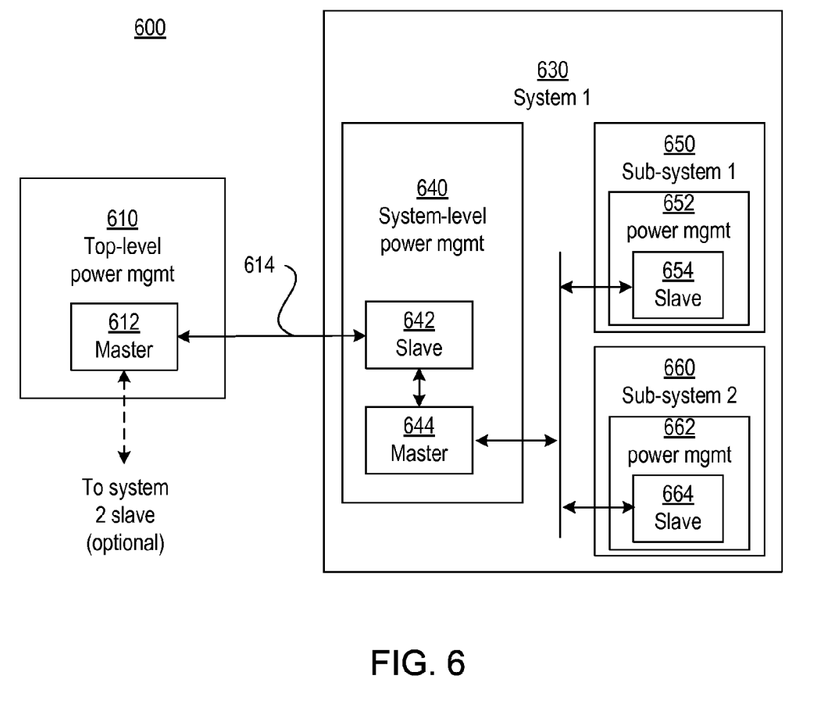
FIG. 6 shows an apparatus having a hierarchical arrangement of master-slave communication interfaces, consistent with one or more implementations.

As previously described, different implementations may use various communication circuits and/or protocols to communicate data between the ADC and the interface circuit on an IC and between the interface circuit and the power supply connected to the IC. FIG. 6 shows an apparatus having a hierarchical arrangement of master and slave communication interfaces, consistent with one or more implementations. The apparatus 600 includes a top-level power management (TLPM) circuit (TLPM) 610 on a first die and including a first master communication interface 612. The TLPM 610 is configured to control and/or monitor one of more systems in the apparatus 600 via the first master communication interface 612. Each of the systems is disposed on one or more additional dies, which may be included in the same IC package as the top-level TLPM 610 or in IC packages separate from the IC package including TLPM 610. In this example, the apparatus 600 includes one system 630, which is controlled and/or monitored by the TLPM 610. However, in some implementations, the TLPM 610 may be configured to control and/or monitor additional systems. In this example, the system includes a system-level power management circuit (SLPM) 640 having a first slave communication interface 642 communicatively coupled to the first master communication interface 612. The TLPM 610 and the SLPM 640 communicate data 614 via the master communication interface 612 and the slave communication interface 642.

The SLPM 640 also includes a second master communication interface 644. The SLPM 640 is configured to control and/or monitor one of more sub-systems 650 and 660 of the system 630 via the second master communication interface 644. The sub-systems 650 and 660 may be disposed on the same IC die SLPM 640 or on separate IC dies. Each of the sub-systems 650 and 660 includes a respective power sub-system-level power management circuit 652 or 654. Each of the sub-system-level power management circuit 652 and 654 includes a respective slave communication interface 654 and 664 communicatively coupled to the second master communication interface 644. The sub-system-level power management circuits 652 and 654 communicate data with the SLPM 640 via the slave communication interfaces 654 and 664. For instance, via the sub-system-level power management circuits 652 and 654 the SLPM 640 may adjust voltage regulators included in or retrieve status parameter data gathered from sensors included in the sub-systems 650 and 660. In some implementations, a sub-system-level power management circuits (e.g., 652) may also include another master interface (not shown) to communicate with one or more tertiary slave circuits included in the sub-system (e.g., 650).

In different implementations, the master and slave communication interfaces 612, 642, 644, 654, and 664 may communicate data using various communication protocols including, for example, System Management Bus (SMBus) and Advanced Microcontroller Bus Architecture (AXI). In some implementations, the master and slave communication interfaces are configured to communicate using the Power Management Bus (PMBus) protocol. PMBus is a variant of SMBus with commands useful for digital management of power in a system. PMBus allows a master communication interface to issue control commands to or request status parameters from slave communication interfaces. PMBus is particularly useful in devices having a central circuit for control of multiple systems. However, as complexity of devices and applications increase, it is not always feasible to design a central circuit to interface with all sub-systems requiring control or monitoring. The hierarchical arrangement shown in FIG. 6 can reduce complexity needed to implement the control or monitoring circuits.

As an illustrative example, the TLPM 610 may be configured to monitor the operating status of all systems in the apparatus 600 to ensure that all circuits are operating correctly. For system 630, this may require monitoring of several independent sub-systems. However, it may be overly burdensome to relay status queries and responses between the sub-systems 650 and 660 and the TLPM 610. In some implementations, the SLPM 640 may be configured to retrieve operating statuses from power management circuits 652 and 654 in the sub-systems 650 and 660 and determine an overall operating status of the system 630. The SLPM 640 can then provide the overall operating status to the TLPM 610.

In some implementations, the circuits shown in FIGS. 1 and 2 may communicate using the hierarchical arrangement of master and slave communication interfaces shown in FIG. 6. For example, the programmable power supply 110 may include the TLPM 610 and the interface circuit 134 may include the SLPM 640. A sub-system of the IC 130 may include the ADC 132 and a slave circuit 654 configured to communicate data between the ADC 132 and the interface circuit via the SLPM 640.

The SLPM 640 may communicate power-related parameter data with the top-level control circuit 610 in the programmable power supply 110 via the slave communication interface 642. The SLPM 640 may communicate power-related parameter data with the ADC 132 via the second master communication interface 644.

Figure 7:
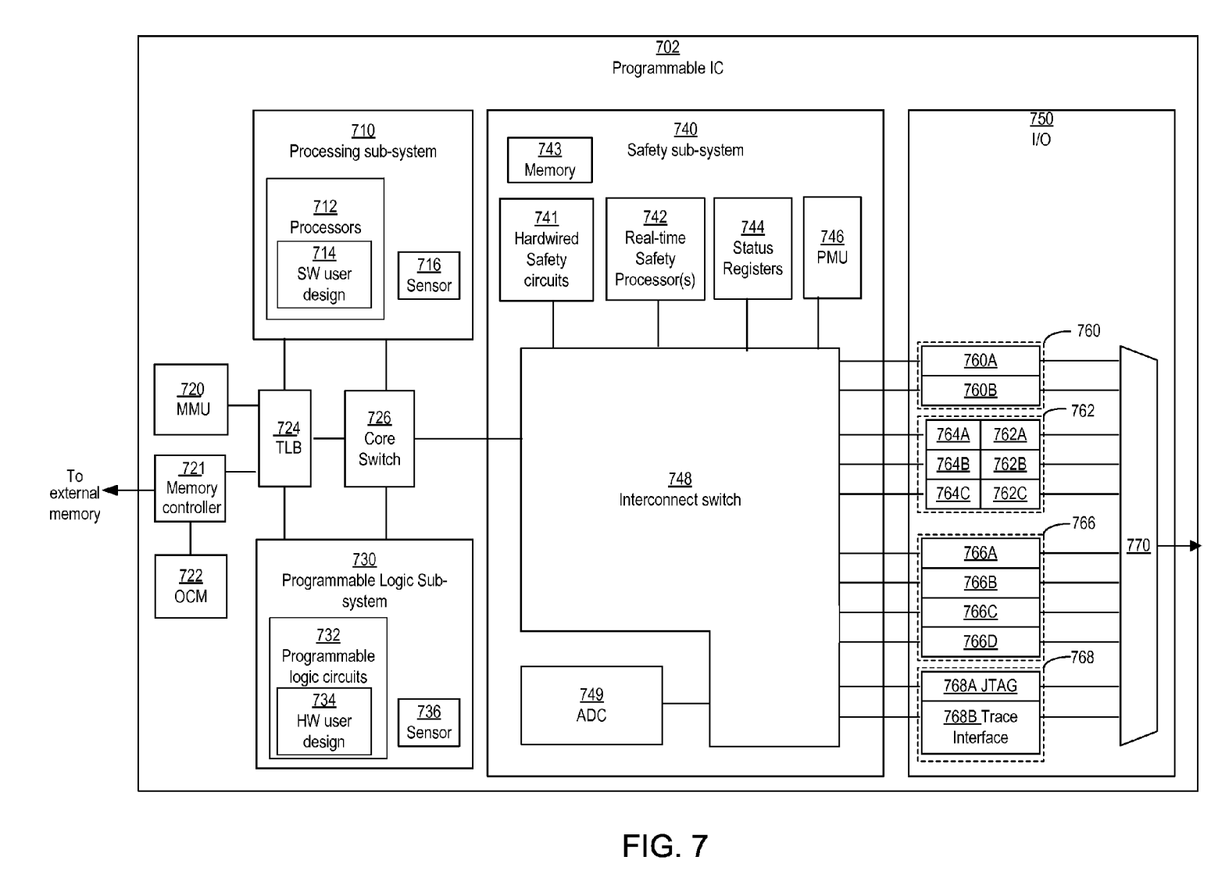
FIG. 7 shows a programmable IC that may be configured to control power, in accordance with one or more implementations.

FIG. 7 shows a programmable IC 702 that may be configured in accordance with one or more implementations. The programmable IC may also be referred to as a System-on-chip (SOC), which includes a processing sub-system 710 and a programmable logic sub-system 730. The processing sub-system 710 may be programmed to implement a software portion of the user design, via execution of a user program. The program may be specified as part of a set of configuration data or may be retrieved from an on-chip or off-chip data storage device. The processing sub-system 710 may include various processing circuits 712 for executing a software implementation of a user design 714. The processing circuits 712 may include, for example, one or more processor cores, floating point units (FPUs), an interrupt processing unit, on chip-memory, memory caches, and/or a cache coherent interconnect. In various implementations, the processing sub-system 710 may also include a sensor 716 configured to measure one or more analog operating parameters including, for example, temperature or operating voltage of circuits in the sub-system.

The programmable logic sub-system 730 of the programmable IC 702 may be programmed to implement a hardware portion of a user design. For instance, the programmable logic sub-system may include a number of programmable logic circuits 732, which may be programmed to implement a set of circuits specified in a set of configuration data. The programmable logic circuits 732 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs). In various implementations, the programmable logic sub-system 730 may also include a sensor 736 configured to measure one or more analog operating parameters including, for example, temperature or operating voltage of circuits in the sub-system.

The programmable logic circuits 732 may be programmed by loading a set of configuration data into the configuration memory cells, which define how the programmable interconnect circuits and programmable logic circuits are configured. The collective states of the individual memory cells then determine the function of the programmable logic circuits 732. The configuration data can be read from memory (e.g., from an external PROM) or written into the programmable IC 702 by an external device. In some implementations, configuration data may be loaded into configuration memory cells by a configuration controller 734 included in the programmable logic sub-system 730. In some other implementations, the configuration data may be loaded into the configuration memory cells by a start-up process executed by the processing sub-system 710.

The programmable IC 702 may include various circuits to interconnect the processing sub-system 710 with circuitry implemented within the programmable logic sub-system 730. Connections between circuits and sub-systems are illustrated as lines in FIG. 7. The various connections may be single or multi-bit signal lines and may be uni-directional or bi-directional. In this example, the programmable IC 702 includes a core switch 726 that can route data signals between various data ports of the processing sub-system 710 and the programmable logic sub-system 730. The core switch 726 may also route data signals between either of the programmable logic or processing sub-systems 710 and 730 and various other circuits of the programmable IC, such as an internal data bus. Alternatively or additionally, the processing sub-system 710 may include an interface to directly connect with the programmable logic sub-system—bypassing the core switch 726. Such an interface may be implemented, for example, using the AMBA AXI Protocol Specification (AXI) as published by ARM.

In some implementations, the processing sub-system 710 and the programmable logic sub-system 730 may also read or write to memory locations of an on-chip memory 722 or off-chip memory (not shown) via memory controller 721. The memory controller 721 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 721 is able to communicate is provided for purposes of illustration only and is not intended as a limitation or to be exhaustive. As shown in FIG. 7, the programmable IC 702 may include a memory management unit 720 and translation look-aside buffer 724 to translate virtual memory addresses used by the sub-systems 710 and 730 to physical memory addresses used by the memory controller 721 to access specific memory locations.

The programmable IC may include an input/output (I/O) sub-system 750 for communication of data with external circuits. The I/O sub-system 750 may include various types of I/O devices or interfaces including for example, flash memory type I/O devices, higher performance I/O devices, lower performance interfaces, debugging I/O devices, and/or RAM I/O devices.

The I/O sub-system 750 may include one or more flash memory interfaces 760 illustrated as 760A and 760B. For example, one or more of flash memory interfaces 760 can be implemented as a Quad-Serial Peripheral Interface (QSPI) configured for 4-bit communication. One or more of flash memory interfaces 760 can be implemented as a parallel 8-bit NOR/SRAM type of interface. One or more of flash memory interfaces 760 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 750 can include one or more interfaces 762 providing a higher level of performance than flash memory interfaces 760. Each of interfaces 762A-762C can be coupled to a DMA controller 764A-764C respectively. For example, one or more of interfaces 762 can be implemented as a Universal Serial Bus (USB) type of interface. One or more of interfaces 762 can be implemented as a gigabit Ethernet type of interface. One or more of interfaces 762 can be implemented as a Secure Digital (SD) type of interface.

The I/O sub-system 750 may also include one or more interfaces 766 such as interfaces 766A-766D that provide a lower level of performance than interfaces 762. For example, one or more of interfaces 766 can be implemented as a General Purpose I/O (GPIO) type of interface. One or more of interfaces 766 can be implemented as a Universal Asynchronous Receiver/Transmitter (UART) type of interface. One or more of interfaces 766 can be implemented in the form of a Serial Peripheral Interface (SPI) bus type of interface. One or more of interfaces 766 can be implemented in the form of a Controller-Area-Network (CAN) type of interface and/or an I$^2$C type of interface.

The I/O sub-system 750 can include one or more debug interfaces 768 such as processor JTAG (PJTAG) interface 768A and a trace interface 768B. PJTAG interface 768A can provide an external debug interface for the programmable IC 702. Trace interface 768B can provide a port to receive debug, e.g., trace, information from the processing sub-system 710 or the programmable logic sub-system 730.

As shown, each of interfaces 760, 762, 766, and 768 can be coupled to a multiplexer 770. Multiplexer 770 provides a plurality of outputs that can be directly routed or coupled to external pins of the programmable IC 702, e.g., balls of the package within which the programmable IC 702 is disposed. For example, I/O pins of programmable IC 702 can be shared among interfaces 760, 762, 766, and 768. A user can configure multiplexer 770, via a set of configuration data to select which of interfaces 760-768 are to be used and, therefore, coupled to I/O pins of programmable IC 702 via multiplexer 770. The I/O sub-system 750, may also include a fabric multiplexer I/O (FMIO) interface (not shown) to connect interfaces 762-768 to programmable logic circuits of the programmable logic sub-system. Additionally or alternatively, the programmable logic sub-system 730 can be configured to implement one or more I/O circuits within programmable logic. In some implementations, the programmable IC 702 may also include a sub-system 740 having various circuits for power and/or safety management. For example, the sub-system 740 may include a power management unit 746 configured to monitor and maintain one or more voltage domains used to power the various sub-systems of the programmable IC 702. In some implementations, the power management unit is configured to generate and output a control signal, for example via interfaces 760, 762, 766, and 768, to a power supply coupled to the programmable IC 702. As described with reference to FIGS. 1 and 2, the control signal may be set to adjust a voltage of the power supply based on one or more parameters of the programmable IC. In some implementations, the power management unit 746 may disable power of individual sub-systems, when idle, to reduce power consumption, without disabling power to sub-systems in use.

The sub-system 740 may also include safety circuits to monitor the status of the sub-systems to ensure correct operation. For instance, the sub-system 740 may include one or more hard-wired safety circuits 741 configured to perform safety functions for various sub-systems or circuits of the programmable IC. The sub-system 740 may also include one or more real-time processors 742 configured to execute various software-based safety functions for various sub-systems or circuits of the programmable IC.

The sub-system 740 may include one or more sensors or detectors (not shown) configured to monitor various operating parameters of the programmable IC (e.g., voltage, temperature, clocks and/or data/control signals). In this example, the sub-system 740 includes an ADC 749 that may be used to quantize one or more analog signals, generated by various sensors or detectors on the programmable IC, such as sensors

716 and 736. Analog signals may be routed from the sensors 716 and 736 to the ADC 749 via various hardwired or programmable routing resources, such as core switch 726 or interconnect switch 748.

Data flow to and from the ADC 749 is controlled by interconnect switch 748. The interconnect switch 748 may be set to provide quantized values from the ADC to the power management unit 746 directly or indirectly by saving quantized values to status registers 744. The status registers may be accessed, for example, by the hard-wired safety circuits 741, real-time processors 742, or power management unit 746.

The safety functions may monitor the status of the various sub-systems and perform various actions to facilitate detection, prevention, and/or mitigation of errors in one or more sub-systems or circuits. In some implementations, the safety functions may take action in response to the status registers having values indicative of an error. For example, a safety function may generate an alert in response to detecting an error. As another example, a safety function may reset an individual sub-system to attempt to restore the sub-system to correct operation, as discussed with reference to FIGS. 1 and 2.

Sub-systems or circuits to be monitored and conditions in which sub-systems are to be reset may be specified in a safety policy stored in a memory 743. The safety policy performed by the safety sub-system may be hardcoded in a non-volatile memory or may be stored in the memory at startup. In some implementations, the safety policy may be user configurable and provided, for example, in a subset of a set of configuration data.

The sub-system 740 includes an interconnect switch network 748 that may be used to interconnect various sub-systems. For example, the interconnect switch network 748 may be configured to connect the various sub-systems 710, 730, and 740 to various interfaces of the I/O sub-system 750. In some applications, the interconnect switch network 748 may also be controlled by one or more safety functions of the hard-wired safety circuits 741 or real-time safety processors 742 to isolate the real-time processors 742 from the sub-systems that are to be monitored. Such isolation may be required by certain application standards (e.g., IEC-61508 SIL3 or ISO-26262 standards) to ensure that the real-time processors 742 are not affected by errors that occur in other sub-systems. In some applications, interconnect switch network 748 may also be protected (e.g., by ECC or parity) to provide protection against random faults. In some applications, the interconnect switch network 748 may be protected by software-based tests that are periodically performed to test the interconnect switch network 748.

In some implementations, some safety functions may be performed by redundant hard-wired circuits of the hard-wired safety circuits 741. For example, the power management unit 746 may be protected by a safety function performed by a triple modular redundant circuit of the hard-wired safety circuits 741. For example, the hard-wired circuits of the safety sub-system may include a triple modular redundant circuit configured to monitor a power management unit of the programmable IC. As another example, the programmable IC may include a configuration security unit configured to prevent unintended reconfiguration of programmable logic circuits (e.g., during reset of the processing sub-system 710). The configuration security unit may similarly be protected by triple modular redundant circuits.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. An apparatus, comprising:
    a power supply configured to generate a supply voltage at an output and adjust the supply voltage according to a control signal; and
    an integrated circuit (IC) die coupled to the power supply and including:
        a power terminal coupled to receive the supply voltage generated by the power supply;
        a plurality of programmable hardware resources;
        an analog-to-digital converter (ADC) disposed on the IC die and configured to quantize values of one or more analog parameters of the IC die;
        a configuration control circuit disposed on the IC die and configured to, in response to a set of configuration data, program the programmable hardware resources to implement a set of circuits specified by the set of configuration data, and connect the ADC to respective nodes of the IC die for sampling the one or more analog parameters; and
        an interface circuit coupled to the ADC and configured to generate the control signal, based on quantized values of the one or more analog parameters from the ADC, and output the control signal to the power supply.

2. The apparatus of claim 1, wherein the ADC is configured to quantize at least one voltage of a power distribution node of the IC die.

3. The apparatus of claim 2, wherein the interface circuit is configured and arranged to adjust the control signal based on a difference between the voltage quantized by the ADC and a target voltage.

4. The apparatus of claim 3, wherein the interface circuit is configured to determine the target voltage from a look up table having different target voltages indicated for different values of the quantized one or more analog parameters.

5. The apparatus of claim 3, wherein the interface circuit is further configured to:
    in response to the IC die being powered on, and prior to programming the programmable hardware resources, store a first quantized value of the voltage of the power distribution node;
    after programming the programmable hardware resources, store a second quantized value of the voltage of the power distribution node; and
    determine the target voltage based on a difference between the first and second quantized values.

6. The apparatus of claim 2, wherein the interface circuit is configured and arranged to adjust the control signal to maintain the voltage quantized by the ADC within a range specified in a non-volatile memory disposed on the IC die.

7. The apparatus of claim 6, wherein the interface circuit is configured to generate an alert signal in response to the quantized value being outside of the range.

8. The apparatus of claim 1, wherein:
    the interface circuit is configured to provide at least one of the quantized values to the power supply; and
    the power supply is configured to adjust a voltage provided by the power supply to the power terminal of the IC die based on the at least one of the quantized values.

9. The apparatus of claim 1, wherein the one or more analog parameters of the IC die includes a voltage of a power distribution node in the IC die.

10. The apparatus of claim 1, wherein the one or more analog parameters of the IC die includes a voltage of an input or output terminal of the IC die.

11. The apparatus of claim 1, wherein:
the IC die further includes a temperature sensor; and
the one or more analog parameters includes an analog temperature signal output by the temperature sensor.

12. An apparatus, comprising:
a plurality of programmable hardware resources disposed on an integrated circuit (IC) die;
an analog-to-digital converter (ADC) disposed on the IC die and configured to quantize values of one or more analog parameters of the IC die;
a configuration control circuit disposed on the IC die and configured to, in response to a set of configuration data, program the programmable hardware resources to implement a set of circuits specified by the set of configuration data, and connect the ADC to respective nodes of the IC die for sampling the one or more analog parameters;
an interface circuit coupled to the ADC and configured to generate a control signal, based on quantized values of the one or more analog parameters from the ADC, and output the control signal to a power supply coupled to a power terminal of the IC die, wherein the interface circuit includes a first slave communication interface configured to provide the control signal to a first master communication interface in the power supply, and a second master communication interface; and
a second slave communication interface coupled to the ADC and the second master communication interface and configured to provide the quantized values of the one or more analog parameters from the ADC to the second master communication interface.

13. The apparatus of claim 12, wherein the first slave communication interface is configured to provide the control signal to the first master communication interface in the power supply in response to receiving a prompt from the first master communication interface.

14. The apparatus of claim 12, further comprising:
a second ADC disposed on the IC die and configured to quantize a value of at least one additional parameters of the IC die; and
a third slave communication interface coupled to the second master communication interface and configured to provide the quantized value of the at least one additional parameters from the second ADC to the second master communication interface.

15. An apparatus, comprising:
a top-level power management circuit disposed on a first die and including a first master communication interface; and
a system disposed on one or more additional dies and including:
a system-level power management circuit having
a first slave communication interface the first master communication interface, and
a second master communication interface;
one or more sub-system power management circuits having respective second slave communication interfaces communicatively coupled to the second master communication interface; and
wherein at least one of the one or more sub-system power management circuits includes:
a plurality of programmable hardware resources;
an analog-to-digital converter (ADC) configured to quantize values of one or more analog parameters of the sub-system power management circuit;
a configuration control circuit configured to, in response to a set of configuration data, program the programmable hardware resources to implement a set of circuits specified by the set of configuration data, and connect the ADC to respective nodes of the IC die for sampling the one or more analog parameters;
an interface circuit coupled to the ADC and configured to generate a control signal, based on quantized values of the one or more analog parameters from the ADC, and output the control signal to a power supply coupled to a power terminal of the IC die, wherein the interface circuit includes the respective second slave communication interface configured to provide the control signal to the second master communication interface, and a third master communication interface; and
a third slave communication interface coupled to the ADC and the third master communication interface and configured to provide the quantized values of the one or more analog parameters from the ADC to the third master communication interface.

16. The apparatus of claim 15, wherein the system-level power management circuit is configured to:
communicate power-related parameter data with the top-level power management circuit via the first slave communication interface; and
communicate power-related parameter data with the sub-system power management circuits via the second master communication interface.

17. The apparatus of claim 16, wherein the system level power management circuit is further configured to:
retrieve an operating status from the sub-system power management circuits via the second master communication interface;
determine an overall operating status of the system based on the operating status parameters retrieved from the sub-system circuits; and
communicate the overall operating status of the system to the top-level power management circuit via the first slave communication interface.

18. The apparatus of claim 17, wherein the master and slave communication interfaces are configured to communicate using a communication protocol having a set of power management control commands.

* * * * *